United States Patent [19]

Asami

[11] Patent Number: 5,577,000
[45] Date of Patent: Nov. 19, 1996

[54] SENSE AMPLIFIER CIRCUIT

[75] Inventor: Kazuo Asami, Hyogo, Japan

[73] Assignees: Mitsubishi Electric Semiconductor Software Co., Ltd., Itami; Mitsubishi Denki Kabushiki Kaisha, Tokyo, both of Japan

[21] Appl. No.: 458,482

[22] Filed: Jun. 2, 1995

[30]  Foreign Application Priority Data

Jan. 9, 1995 [JP] Japan .................................. 7-001304

[51] Int. Cl.⁶ .................................................... G11C 7/00
[52] U.S. Cl. ........................... 365/205; 365/149; 365/210
[58] Field of Search ................................... 365/205, 149, 365/210, 207, 208, 203

[56]  References Cited

U.S. PATENT DOCUMENTS

| | | | |
|---|---|---|---|
| 4,578,781 | 3/1986 | Ogawa et al. | 365/205 |
| 4,692,642 | 9/1987 | Fukuzo et al. | 365/205 |
| 4,907,200 | 3/1990 | Ikawa et al. | 365/210 |
| 5,243,573 | 9/1993 | Makihara et al. | 365/210 |

Primary Examiner—David C. Nelms
Assistant Examiner—Vũ A. Lê
Attorney, Agent, or Firm—Oblon, Spivak, McClelland, Maier & Neustadt, P.C.

[57]  ABSTRACT

A sense amplifier circuit comprising a capacitor 12 having a capacity larger than a parasitic capacity 32 of a selected bit line 33, and a differential amplifier 30 for fixing, after the determination of the read data, the voltage level of the selected bit line to a level at which a read current does not flow through said selected bit line, or for cutting a quasi-write in current so as not to be flown into the selected memory cell, thereby the consuming current is reduced and damage of data due to quasi write in is prevented.

4 Claims, 4 Drawing Sheets

5,577,000

SENSE AMPLIFIER CIRCUIT

BACKGROUND OF THE INVENTION

1. Field of the Invention

The present invention relates to a sense amplifier circuit for reading data from a memory device such as an E$^2$PROM in which, after read data is determined, current flowing through a memory cell is prevented to attain reduction of consuming current.

2. Description of the Prior Art

FIG. 6 is a circuit diagram showing an example of a prior art sense amplifier circuit disclosed in, for example, "LSI Gijyutsu No Kiso (Basic of LSI Technology)" page 179, issued on Jan. 30, 1992 by Denki Tsushin Kyoukai. In the figure, reference numeral 61 denotes a P-channel transistor as a switch for supplying power to the sense amplifier circuit in response to a driving signal supplied through a driving signal input terminal 73 and an inverter 67; 62 and 63 denote P-channel transistors constituting a part of a differential amplifier 66; 64 and 65 denote N-channel transistors constituting another part of the differential amplifier 66; 68 and 69 denote wiring lines which are an input and an output of the differential amplifier 66; 70 denotes a CMOS inverter for inverting the output of the sense amplifier circuit; 71 denotes a data input terminal for inputting data read from a selected memory transistor (hereinafter referred to as a memory cell) 72 through a selected bit line BL into the sense amplifier circuit; and BL (hereinafter written as BL bar) is a bit line connected to a dummy memory cell.

Next, the operation of the circuit shown in FIG. 1 is described. When the driving signal input to the driving signal input terminal 73 at a data read out time is turned to a high level (hereinafter referred to as an H level), the P-channel transistor 61 is turned on through the inverter 67 so that power is supplied to the sense amplifier circuit. Then, depending on whether or not charges are present in a floating gate of the selected memory cell 72 connected to the selected bit line BL, a current $I_E$ flows or does not flow through the bit line BL. To the bit line BL bar, a reference voltage is applied in advance. The differential amplifier 66 amplifies the potential difference between the bit line BL and the bit line BL bar to output read data from this sense amplifier circuit through the output wiring line 69 and the inverter 70.

Since the prior art sense amplifier circuit is constructed as above, the bit line BL is directly connected to the wiring line 68 so that, when charges are present in the floating gate of the selected memory cell 72 and therefore the read out current $I_E$ flows between the drain and the source of the memory cell (that is, when the read out data is at the low level (hereinafter referred to as L level)), the P-channel transistors 61 and 62 are in their on states so that, even after the data read out from the sense amplifier circuit is fixed, the read out current $I_E$ continues to flow from the power supply VDD through the P-channel transistors 61 and 62 and between the drain and the source of the memory cell 72, during operating of the sense amplifier circuit when the driving signal is applied to the driving signal input terminal 73. Accordingly, there is a problem of large consuming current.

Further, when there is no charge in the floating gate of the selected memory cell 72, no read out current $I_E$ flows so that the bit line B1 becomes the H level, however, even after the read out data is fixed, a pseudo write-in current flows from the H level bit line BL to the memory cell 72 during the operation of the sense amplifier circuit so that there is a problem in that, not only the data in the memory cell is damaged, but also the consuming current becomes large.

Still further, the input of the CMOS inverter 70 connected to the output of this sense amplifier circuit is, before the output of the sense amplifier circuit is fixed, at an intermediate level between the H level and the L level, so that a current passes through the CMOS inverter 70, thereby there is a problem of large consuming current.

SUMMARY OF THE INVENTION

To remove the above-mentioned problems, an object of the present invention is to provide a sense amplifier circuit in which a current does not pass through a memory cell after data read out from a memory cell is fixed, so as to reduce the consuming current.

Another object of the present invention is to provide a sense amplifier circuit in which a quasi write-in current does not flow through a memory cell after data read out from the sense amplifier circuit is fixed, so as to prevent damage of data and to reduce the consuming current.

Still another object of the present invention is to provide a sense amplifier circuit in which a current does not flow through a CMOS inverter provided at the output stage, so as to further reduce the consuming current.

To attain the above objects, there is provided, according to the first aspect of the present invention, a sense amplifier circuit for reading data from a selected memory cell connected to a selected bit line, comprising a capacitor having an end connected to ground and having a capacity larger than a parasitic capacity of the selected bit line, a current supplying part for supplying, substantially simultaneously, a current to the selected bit line and to another end of the capacitor, to raise potentials of the selected bit line and the another end of the capacitor, and a differential amplifier for determining data read from the memory cell by comparing the potentials raised by the current supplying part, and for fixing, after the determination of the read data, the voltage level of the selected bit line to a level at which a read current does not flow through the selected bit line.

As stated above, by the sense amplifier according to the first aspect of the present invention, since the voltage level of the bit line after determining the read data is fixed to the level at which a read current does not flow through the selected memory cell, the consuming current of the sense amplifier circuit can be reduced.

According to the second aspect of the present invention, there is provided a sense amplifier circuit in which the current supplying part in the first aspect of the invention supplies a current to the selected bit line and to the capacitor in response to a driving signal for driving the sense amplifier circuit.

As stated above, by the sense amplifier circuit according to the second aspect of the present invention, since the current supplying part supplies a current to the selected bit line and to the capacitor in response to a driving signal for driving the sense amplifier circuit, the consuming current of the sense amplifier circuit during driving of the sense amplifier circuit can be reduced.

According to the third aspect of the present invention, there is provided a sense amplifier circuit in which the current supplying part in the first aspect of the invention is controlled by the output of the differential amplifier.

As stated above, by the sense amplifier circuit according to the third aspect of the present invention, when the rise of the potential of the bit line due to the charging of the parasitic capacitor of the bit line is faster than the rise of the potential of the capacitor due to the charging of the capacitor, the supply of a quasi write-in current to the bit line which is selected after reading data is cut so that damage of data in the memory cell after determining the read data can be prevented, and the consuming current of the sense amplifier circuit can be further reduced.

According to the fourth aspect of the present invention, there is provided a sense amplifier circuit further comprising, in addition to the features in the first aspect of the present invention, a switch which is turned on when there is the data having the fixed level output from the differential amplifier and a reading command signal for instructing to read data from the sense amplifier circuit.

As stated above, by the sense amplifier according to the fourth aspect of the present invention, the voltage level fixed to the H level or the L level is applied to the output stage CMOS inverter connected to the switch, so that a current passing through the CMOS inverter can be prevented.

The above and further objects and novel features of the present invention will more fully appear from the following detailed description when the same is read in connection with the accompanying drawings. It is to be expressly understood, however, that the drawings are for purpose of illustration only and are not intended as a definition of the limits of the invention.

DESCRIPTION OF THE PREFERRED EMBODIMENTS

Embodiment 1.

In the following, an embodiment of the present invention will be described with reference to the drawings.

Figure 1:
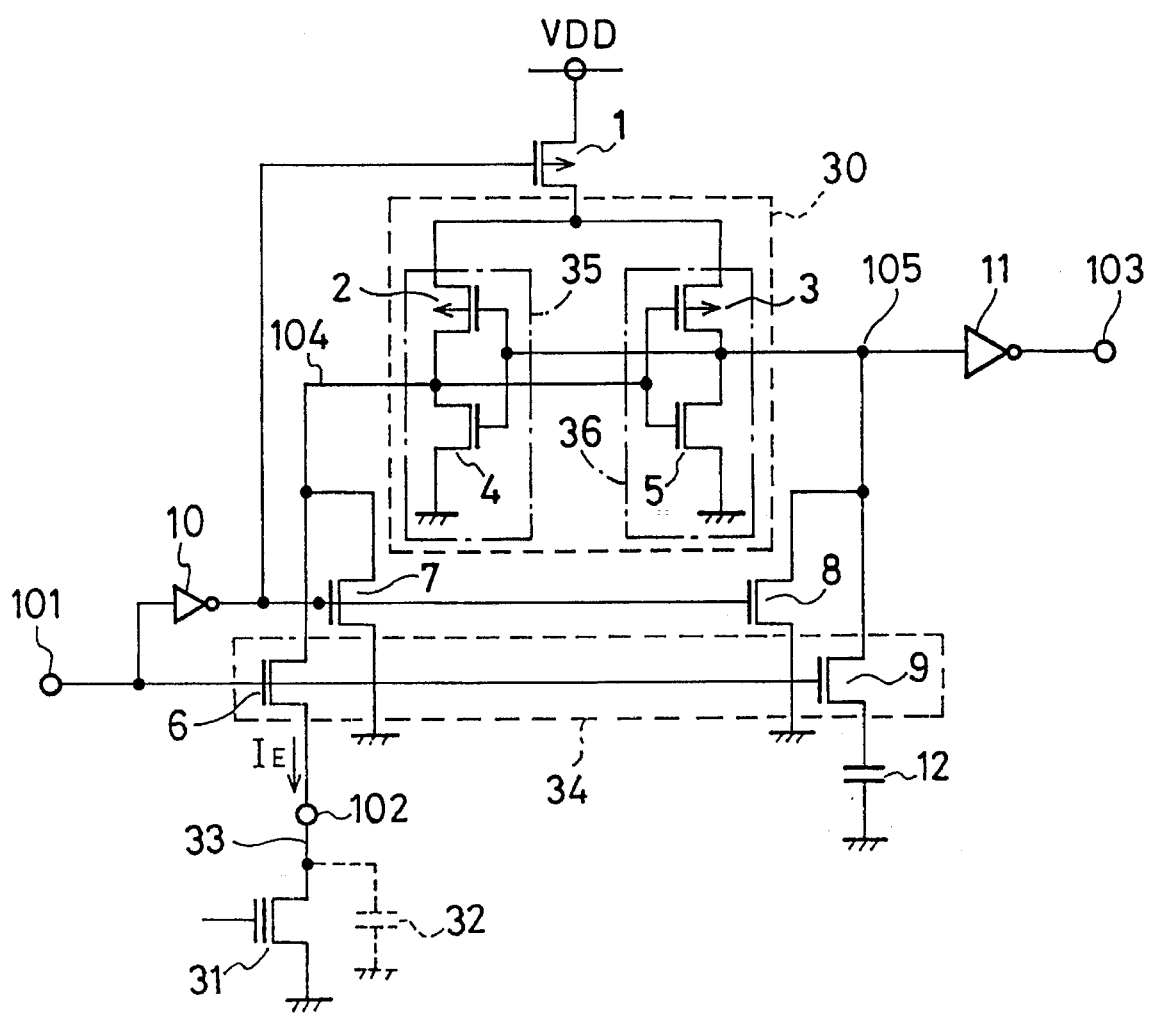
FIG. 1 is a circuit diagram showing a sense amplifier circuit according to an embodiment of the present invention.

FIG. 1 is a circuit diagram showing a sense amplifier circuit according to an embodiment of the present invention and one memory cell connected to thereto. In the figure, reference numeral 1 denotes a P-channel transistor (hereinafter referred to as a Pch transistor) which is turned off to prevent a current to pass through the sense amplifier circuit when the level at a driving signal input terminal 101 is at the L level; reference numerals 2 and 3 denote Pch transistors; and reference numerals 4 and 5 denote N-channel transistors (hereinafter referred to as Nch transistors). The Pch 2 and the Nch 4 constitutes a Complementary Metal Oxide Semiconductor (CMOS) inverter 35. The Pch 3 and the Nch 5 constitute another CMOS inverter 36. The inputs and the outputs of the two CMOS inverters 35 and 36 are cross-coupled to form a differential amplifier 30.

Reference numeral 10 denotes a CMOS inverter connected between the driving signal input terminal 101 and the gate of the Pch transistor 1; 12 denotes a capacitor having a capacity larger than the capacity of parasitic capacitor 32 of the bit line 33; 34 a current supplying part consisting of an Nch transistors 6 and 9 having gates commonly connected to the driving signal input terminal 101; 104 a wiring line connected to the input of the CMOS inverter 35 and to the output of the CMOS inverter 36; 11 a CMOS inverter connected to the wiring line 105; and 103 an output terminal of the sense amplifier circuit. Reference numerals 7 and 8 denote pull down Nch transistors for fixing the wiring lines 104 and 105 to the L level; and VDD a power supply voltage. Further, reference numeral 31 denotes a selected one memory transistor (hereinafter referred to as a memory cell) typically shown among a large number of $E^2$ memory transistors connected to the bit line 33 provided on the outside of the sense amplifier circuit.

Next, the operation of the sense amplifier circuit shown in FIG. 1 is described.

Figure 2:
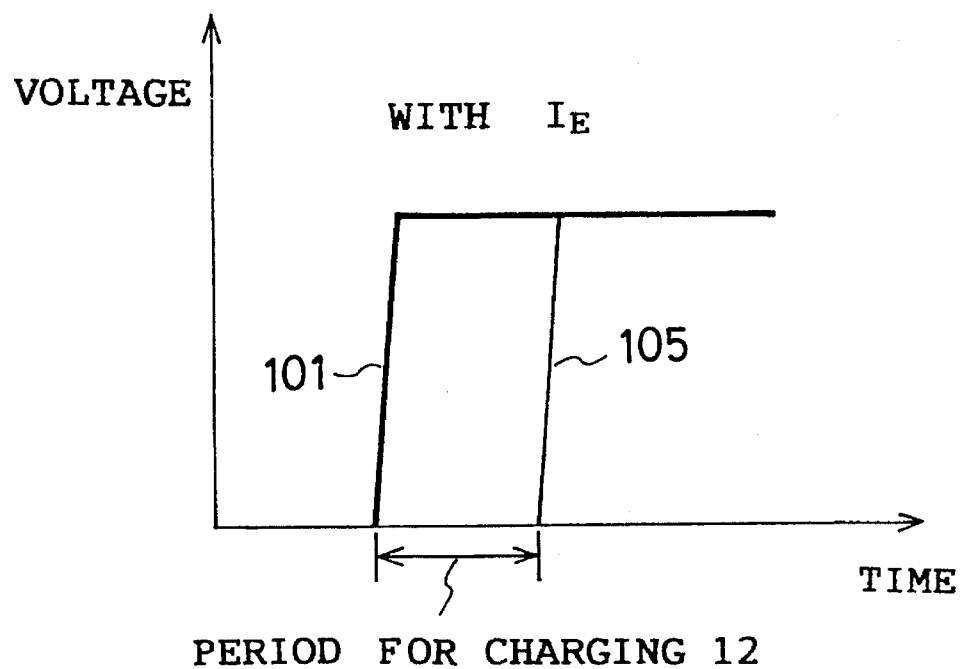
FIG. 2 is a waveform diagram for explaining the operation when there is a memory cell current $I_E$ in the circuit shown in FIG. 1.
Figure 3:
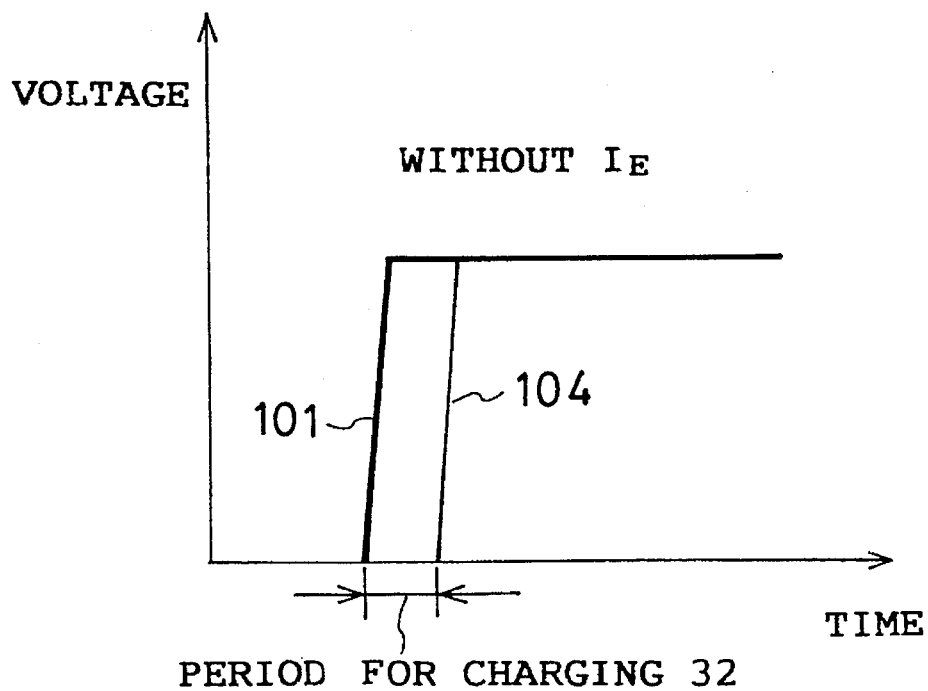
FIG. 3 is a waveform diagram for explaining the operation when there is not a memory cell current $I_E$ in the circuit shown in FIG. 1.

FIG. 2 is a waveform diagram for explaining the operation when there is a memory cell current $I_E$(i.e., when charges are stored in the memory cell 31 so that the read data value is at the low level (L level)), and FIG. 3 is a waveform diagram for explaining the operation when there is not a memory cell current $I_E$(i.e., when no charge is stored in the memory cell 31 so that the read data level is at the H level).

Before operating the sense amplifier circuit, the potential at the driving signal input terminal 101 is at the L level so that, through the CMOS inverter 10, the gate of the Pch 1 is at the H level to keep the Pch 1 in its off state, and, through the CMOS inverter 10, the gates of the pull down Nch transistors 7 and 8 are at the H level to keep the transistors 7 and 8 in their on states. Therefore, the wiring lines 104 and 105 are at the L level.

First, an explanation will be given with reference to FIGS. 1 and 2 for the case when the memory cell current $I_E$ flows. When a voltage of H level is applied to the driving signal input terminal 101, the Nch transistors 7 and 8 are turned off so that the wiring lines 104 and 105 are turned to their floating states, and also the Pch transistor 1 and the Nch transistors 6 and 9 in the current supplying pan 34 are turned on. Immediately after this, the wiring lines 104 and 105 are kept to be at their L level so that the Pch transistors 2 and 3 receiving the L level at their gates are turned on when the Pch transistor 1 is turned on. Therefore, the parasitic capacitor 32 of the bit line 33 connected to the data input terminal 102 and the capacitor 12 start to be charged. As assumed above, since the memory cell current $I_E$ flows through the memory cell 31, the charging speed to charge the capacitor 12 is faster than the charging speed to charge the parasitic capacitor 32. Therefore, as shown in FIG. 2, the level of the wiring line 105 is first turned to the H level after the period for charging the capacitor 12. In response to the H level of the wiring line 105, the Nch transistor 4 having the gate connected to the wiring line 105 is turned on, and the Pch transistor 2 having the gate also connected to the wiring line 105 is turned off. As a result, the level of the wiring line 104 connected to the output of the CMOS inverter 35 is fixed to the L level so that the Pch transistor 3 having the gate connected to the wiring line 104 is turned on, and the Nch transistor 5 having the gate also connected to the wiring line 104 is turned off, resulting in that the level of the wiring line 105 is fixed to the H level so that, through the inverter 11, the level of the output terminal 103 is fixed to the L level.

Since the level of the wiring line 104 is fixed to the L level, no current flows through the memory cell 31 after the level of the output terminal is turned to the L level. Accordingly, the consuming current is reduced in comparison with the prior art sense amplifier circuit.

Next, an explanation will be given with reference to FIGS. 1 and 2 for the case when the memory cell current $I_E$ does not flow. When a voltage of the H level is applied to the driving signal terminal 101, the Nch transistors 7 and 8 are turned off so that the wiring lines 104 and 105 are turned to their floating states, and the Pch transistor 1 and the Nch transistors 6 and 9 in the current supplying part 34 are turned on. Immediately after this, the wiring lines 104 and 105 are kept to be at their L level so that the Pch transistors 2 and 3 receiving the L level at their gates are turned on. Therefore, the parasitic capacitor 32 of the bit line 33 connected to the data input terminal 102 and the capacitor 12 start to be charged. As assumed above, since the memory cell current $I_E$ does not flow through the memory cell 31, and since the capacity of the capacitor 12 is larger than the capacity of the parasitic capacitor 32, the charging speed to charge the parasitic capacitor 32 is faster than the charging speed to charge the capacitor 12. Therefore, as shown in FIG. 3, the level of the wiring line 104 is first turned to the H level after the period for charging the capacitor 32. In response to the H level of the wiring line 104, the Nch transistor 5 having the gate connected to the wiring line 104 is turned on, and the Pch transistor 3 having the gate also connected to the wiring line 104 is turned off. As a result, the level of the wiring line 105 connected to the output of the CMOS inverter 36 is fixed to the L level so that the Pch transistor 2 having the gate connected to the wiring line 105 is turned on, and the Nch transistor 4 having the gate also connected to the wiring line 105 is turned off, resulting in that the level of the wiring line 104 is fixed to the H level. The L level of the wiring line 105 is turned through the inverter 11 to the H level at the output terminal 103. In this case, since the memory cell current $I_E$ does not flow from the beginning, no current flows through the memory cell 31 even after the read data is determined.

It is preferable to make the current amplification factor 13 of the Pch transistors 2 and 3 to be smaller than that of the other Pch transistors. In this case, the time required to charge the parasitic capacitor 32 and the capacitor 12 is longer than that in the above-described embodiment so that the time required to read data from the memory cell becomes longer, however, the total memory cell current $I_E$ which flows until the fixed L level is obtained at the output terminal 103 can be further reduced.

The capacity of the capacitor 12 may be determined as the minimum value of the values larger than the parasitic capacitance of the bit line 33. The parasitic capacitance is determined with reference to regulations for the bit line 33 in the sense amplifier circuit.

In the above-described embodiment 1, when there is no memory cell current $I_E$, the H level voltage continues to be applied to the drain of the memory cell 31 after the level of the wiring line 104 is fixed to the H level and until the level of the driving signal terminal 101 is turned to the L level, so that a quasi write-in may be effected in the memory cell 31.

According to an embodiment 2 described in the following, a sense amplifier circuit is provided in which the quasi write-in is prevented.

Embodiment 2.

Next, another embodiment of the present invention will be described.

Figure 4:
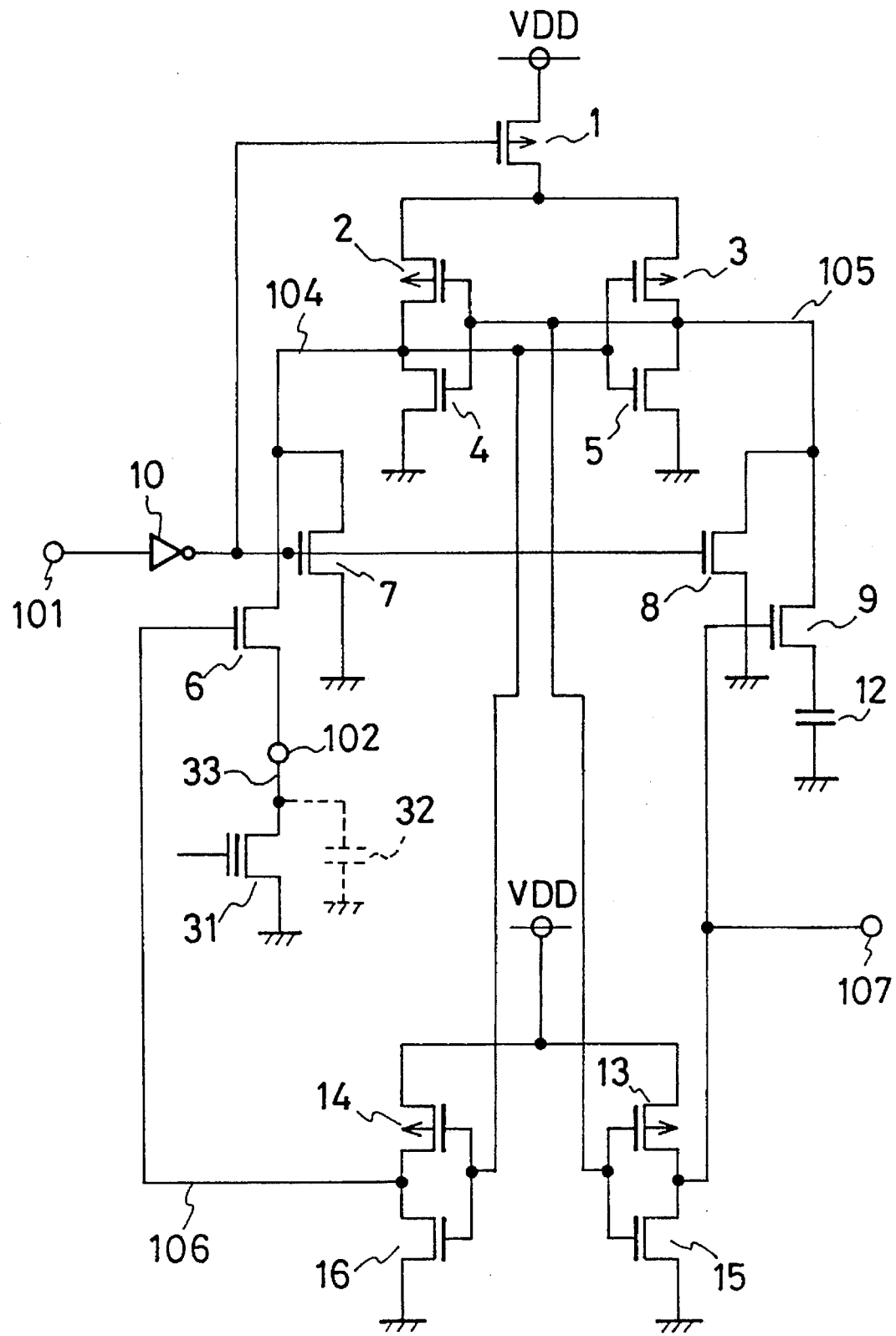
FIG. 4 is a circuit diagram showing a sense amplifier circuit according to another embodiment of the present invention.

FIG. 4 is a circuit diagram showing a sense amplifier circuit and one memory cell connected to the sense amplifier circuit, according to this embodiment. In the figure, reference numerals 1–10, 12, 31, 32, 101, 104, and 105, and VDD are the same as those shown in FIG. 1, and the explanations of them are omitted here. Reference numerals 13 and 14 are Pch transistors; 15 and 16 Nch transistors; 106 a wiring line; and 107 an output terminal of this sense amplifier circuit.

The differences between FIG. 4 and FIG. 1 are that, in FIG. 4, the input of a CMOS inverter consisting of the Pch transistor 14 and the Nch transistor 16 is connected to the wiring line 105; the output of a CMOS inverter consisting of the Pch transistor 14 and the Nch transistor 16 is connected to the gate of the Nch transistor 6; and the output of a CMOS inverter consisting of the Pch transistor 13 and the Nch transistor 15 is connected to the gate of the Nch transistor 9.

Next, the operation of the circuit shown in FIG. 4 will be described.

Before operating the sense amplifier circuit, the potential at the driving signal input terminal 101 is at the L level so that, through the CMOS inverter 10, the gate of the Pch transistor 1 is at the H level to keep the Pch transistor 1 in its off state, and, through the CMOS inverter 10, the gates of the pull down N-channel transistors 7 and 8 are at the H level to keep the transistors 7 and 8 in their on states. Therefore, the levels of the wiring lines 104 and 105 are pull down to the L level. Further, the L level voltage is applied to the gates of the Pch transistors 2 and 3 to which the wiring lines 104 and 105 are respectively connected.

First, an explanation will be given for the case when the memory cell current $I_E$ flows. When a voltage of H level is applied to the driving signal terminal 101, the Nch transistors 7 and 8 are turned off so that the wiring lines 104 and 105 are turned to their floating states, and the Pch transistor 1 is turned on. Immediately after this, the wiring lines 104 and 105 are kept to be at their L level so that the Pch transistors 2 and 3 are in their on states. In addition, since the wiring line 104 is connected to the gates of the Pch transistor 14 and the Nch transistor 16, the Pch transistor 14 is turned on and the Nch transistor 16 is turned off. Further, since the wiring line 105 is connected to the gates of the Pch transistor 13 and the Nch transistor 15, the Pch transistor 13 is turned on and the Nch transistor 15 is turned off. As a result, the Nch transistors 6 and 9 are turned on so that the parasitic capacitor 32 of the bit line 33 connected to the data input terminal 102 and the capacitor 12 start to be charged.

As assumed above, since the memory cell current $I_E$ flows through the memory cell 31 connected to the data input terminal 102, the charging speed to charge the capacitor 12 is faster than the charging speed to charge the parasitic capacitor 32. Therefore, the level of the wiring line 105 is first turned to the H level after the period for charging the capacitor 12, so that the Nch transistor 4 is turned on, and the Pch transistor 2 is turned off.

As a result, the level of the wiring line 104 is fixed to the L level so that the Pch transistor 3 is turned on, and the Nch transistor 5 is turned off, resulting in that the level of the wiring line 105 is fixed to the H level so that, through the inverter 11, the level of the output terminal 103 is fixed to the L level. In response to the fixed H level of the wiring line 105, the Pch transistor 13 is turned off, and the Nch transistor 15 is turned on, so that the output level of the CMOS inverter consisting of the Pch transistor 13 and the Nch transistor 15 is turned to the L level. As a result, the Nch transistor 9 is turned off so that the current path from the H level wiring line 105 to the capacitor 12 is cut.

After the level of the output terminal 107 is fixed to the L level, namely, after the level of the wiring line 104 is fixed to the L level, no current flows through the memory cell 31 even during operating of the sense amplifier circuit, so that the consuming current is reduced in comparison with the prior art sense amplifier circuit in the same way as in the embodiment 1.

Next, an explanation will be given for the case when the memory cell current $I_E$ does not flow. When a voltage of H level is applied to the driving signal terminal 101, the Nch transistors 7 and 8 are turned off so that the wiring lines 104 and 105 are turned to their floating states, and the Pch transistor 1 is turned on. Immediately after this, the wiring lines 104 and 105 are kept to be at their L level so that the Pch transistors 2 and 3 are turned on. Since the wiring line 104 is connected to the gates of the Pch transistor 14 and the Nch transistor 16, the Nch transistor 14 is turned on and the Pch transistor 14 is turned off. Further, since the wiring line 105 is connected to the gates of the Pch transistor 13 and the Nch transistor 15, the Pch transistor 13 is turned off and the Nch transistor 1 is turned off. As a result, the Nch transistors 6 and 9 are turned on to start the charging of the parasitic capacitor 32 of the bit line 33 connected to the data input terminal 102 and the capacitor 12.

As assumed above, since no charge is stored in the floating gate of the memory cell 31 connected to the data input terminal 102, the memory cell current $I_E$ does not flow. In addition, since the capacity of the capacitor 12 is larger than the capacity of the parasitic capacitor 32, the charging speed to charge the parasitic capacitor 32 is faster than the charging speed to charge the capacitor 12. Therefore, the level of the wiring line 104 is first turned to the H level. In response to the H level of the wiring line 104, the Nch transistor 5 is turned on, and the Pch transistor 3 is turned off.

As a result, the level of the wiring line 105 is fixed to the L level so that the Pch transistor 2 is turned on, and the Nch transistor 4 is turned off, resulting in that the level of the wiring line 104 is fixed to the H level. In response to the fixed L level of the wiring line 105, the output of the CMOS inverter consisting of the Pch transistor 13 and the Nch transistor 15 is fixed to the H level. Although this H level voltage is applied to the Nch transistor 9, no current is flown into the capacitor 12 because the drain of the Nch transistor 9 connected to the wiring line 105 is fixed at the L level.

On the other hand, when the level of the wiring line 104 is fixed at the L level, the Pch transistor 14 is kept to an off state, and the Nch transistor 16 is kept to an off state, so that the output level of the CMOS inverter constituting of the Pch transistor 14 and the Nch transistor 16 is kept at the L level. As a result, the Nch transistor 6 is kept to an off state so that the current path from the H level wiring line 104 to the bit line 33 is cut. Therefore, after the level of the output terminal 107 is fixed to the H level, namely, after the wiring line 104 is fixed to the H level, no current is flown into the memory cell 31 so that the quasi-write-in operation can be prevented. Thus, even when there is no memory cell current $I_E$, a quasi write-in current is not flown into the memory cell after the output level of the sense amplifier circuit is fixed, so that the consuming current can be reduced in comparison with the prior art sense amplifier circuit.

Similar to the embodiment 1, it is preferable to make the current amplification factor β of the Pch transistors 2 and 3 to be smaller than that of the other Pch transistors. In this case, the time required to charge the parasitic capacitor 32 and the capacitor 12 is longer than that in the above-described embodiment so that the time required to read data from the memory cell becomes longer, however, the total memory cell current $I_E$ which flows until the fixed L level is obtained at the output terminal 103 can be further reduced.

The capacity of the capacitor 12 may be determined as the minimum value of the values larger than the parasitic capacitance of the bit line 33. The parasitic capacitance is determined with reference to regulations for the bit line 33 in the sense amplifier circuit.

The wiring lines 104 and 105 in the above-described embodiments 1 and 2 are at the floating states between the H level and the L level after they are changed from their pull down L level until they are fixed to the H or L level. In the floating state, when a signal on the wiring line 105 is input to the CMOS inverter 11 shown in FIG. 1, a pass-through current flows through the CMOS inverter 11 to consume power. Also, when a signal on the floating state wiring line 104 is input to the CMOS inverter consisting of the Pch transistor 14 and the Nch transistor 16, a pass-through current also flows through the CMOS inverter. Further, when a signal on the floating state wiring line 105 is input to the CMOS inverter consisting of the Pch transistor 13 and the Nch transistor 15, a pass-through current also flows through the CMOS inverter.

According to the next embodiment, there is provided a sense amplifier circuit in which a pass-through current in a CMOS inverter at the output stage of the sense amplifier circuit can be prevented.

Embodiment 3.

In the following, a further embodiment of the present invention will be described.

Figure 5:
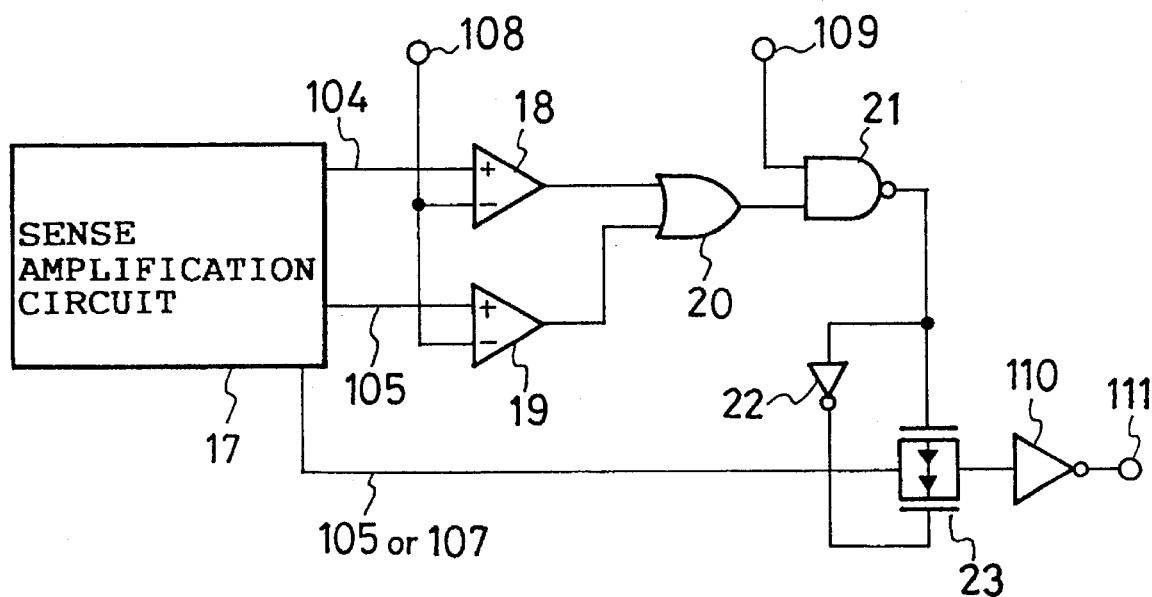
FIG. 5 is a circuit diagram showing a sense amplifier circuit according to still another embodiment of the present invention.
Figure 6:
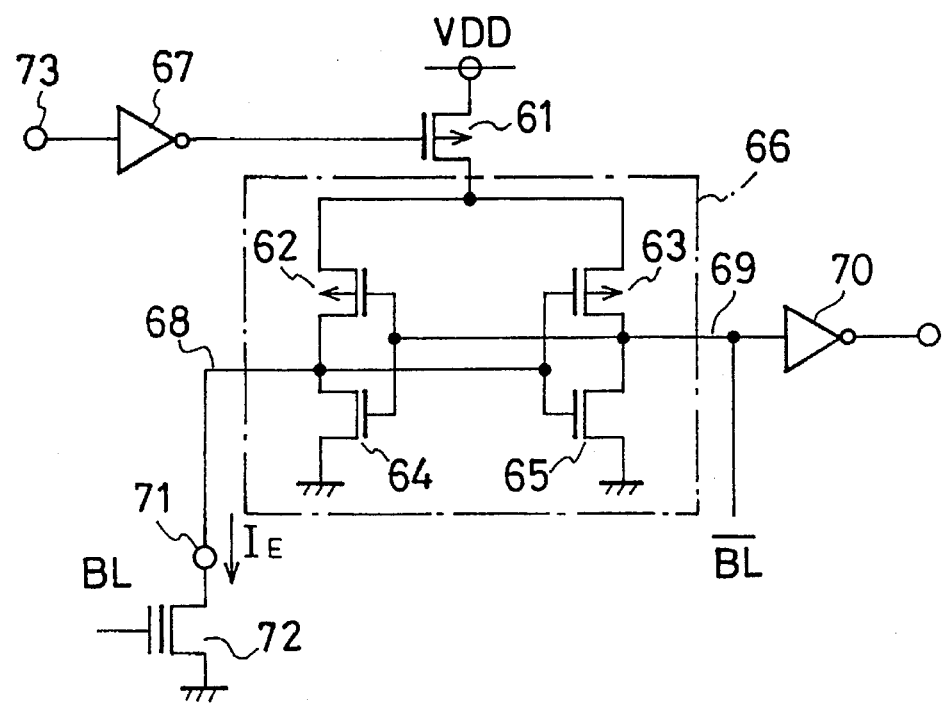
FIG. 6 is a circuit diagram showing a prior art sense amplifier circuit.

FIG. 5 is a circuit diagram showing a sense amplifier circuit according to the further embodiment of the present invention. In the figure, reference numeral 17 denotes a sense amplifier circuit which is the same as that shown in FIG. 1 except that the inverter 11 is removed from the sense amplifier circuit shown in FIG. 1, or which is the same as that shown in FIG. 4. Reference numeral 20 denotes an OR gate; 21 a NAND gate; 22 an inverter; 23 a transmission gate (switch); 104 and 105 wiring lines which are the same as those in the embodiment 1 or 2; 107 an output terminal in the embodiment 2; 109 a data reading command terminal which receives a data reading command signal which is at the H level when data is to be read; 110 a CMOS inverter; and 111 an output terminal of this sense amplifier circuit.

Next, the operation of the circuit shown in FIG. 5 will be described. The operation of the sense amplifier circuit 17 itself is the same as that in the embodiment 1 or 2, and therefore, the explanation thereof is omitted here. When data reading from the memory cell is started by the sense amplifier circuit 17, the level of the wiring line 104 or 105 directs to the H level. When the level of the wiring line 104 or 105 exceeds the threshold level, the comparator 18 or 19 outputs the H level signal. When either one of the comparators 18 an 19 output the H level signal, the OR gate 20 outputs the H level signal. When an H level data reading command signal is input to the data reading command terminal 109, and when the output of the OR gate 20 becomes the H level, the output of the NAND gate 21 turns to the L level so as to turn on the transmission gate 23. Thereby the data read out from the sense amplifier circuit 17 is output through the transmission gate 23 to the output terminal 111.

Since the transmission gate 23 is turned on only when the voltage level of the wiring line 104 or 105 exceeds the threshold level, the CMOS inverter 110 receives a voltage of fixed H or L level. Accordingly, the CMOS inverter 110 does not receive an unstable and increasing voltage of the wiring line 104 or 105 so that the pass-through current in the CMOS inverter 110 can be prevented, resulting in that the consuming current in the sense amplifier circuit can be further reduced.

In the above-described embodiments, an $E^2$ memory cell was used as a memory cell, however, the present invention is not limited to this, but the same effects can be obtained by using a memory cell of another type such as a one-transistor one capacitor type dynamic random access memory (DRAM). Also, the transistors constructing the sense amplifier circuit are not restricted to the MOS transistors, but the same effects can be obtained by using bipolar transistors to form the similar construction.

As described above, according to the first aspect of the present invention, in a sense amplifier circuit, since the voltage level of the bit line after determining the read data is fixed to the level at which a read current does not flow through the selected memory cell, the read out current does not flow through the memory cell after the read out data is determined, so that there is an effect in that the consuming current of the sense amplifier circuit can be reduced.

According to the second aspect of the present invention, since a current is supplied to the selected bit line and to the capacitor in response to a driving signal for driving the sense amplifier circuit, there is an effect in that the consuming current of the sense amplifier circuit during driving the sense amplifier circuit can be reduced.

According to the third aspect of the present invention, when the rise of the potential of the bit line due to the charging of the parasitic capacitor of the bit line is faster than the rise of the potential of the capacitor due to the charging of the capacitor, the supply of a quasi-write current to the bit line, which is selected after reading data, is cut so that there is an effect in that damage of data in the memory cell after determining the read data can be prevented, and the consuming current of the sense amplifier circuit can be further reduced.

According to the fourth aspect of the present invention, the voltage level fixed to the H level or the L level is applied to the output stage CMOS inverter connected to the switch, so that there is an effect in that a current passing through the CMOS inverter can be prevented.

What is claimed is:

1. A sense amplifier circuit for reading data from a selected memory cell connected to a selected bit line, comprising:

a capacitor having an end connected to ground and having a capacity larger than a parasitic capacity of said selected bit line;

a current supplying part for supplying, substantially simultaneously, a current to said selected bit line and to another end of said capacitor, to raise potentials of said selected bit line and said another end of said capacitor; and a differential amplifier for determining data read from said memory cell by comparing said potentials raised by said current supplying part, and for fixing, after the determination of the read data, the voltage level of said selected bit line to a level at which a read current does not flow through said selected bit line.

2. A sense amplifier circuit as claimed in claim 1, wherein said current supplying part supplies the current to said selected bit line and to said capacitor in response to a driving signal for driving said sense amplifier circuit.

3. A sense amplifier circuit as claimed in claim 1, wherein said differential amplifier controls said current supplying part in such a way that, when the increase of the potential of said selected bit line by charging said parasitic capacitor is faster than the increase of the potential of said another end of said capacitor by charging said capacitor, a supply of a pseudo-write current to said selected bit line is cut after the data is read, and when the increase of the potential of said another end of said capacitor by charging said capacitor is faster than the increase of the potential of said selected bit line by charging said parasitic capacitor, supply of a current to said capacitor is cut.

4. A sense amplifier circuit as claimed in claim 1 further comprising a switch which is turned on when there is the data having the fixed level output from said differential amplifier and a read instruction signal for instructing to read data from said sense amplifier circuit, to output said data having the fixed level as the data read from said memory cell.

* * * * *